United States Patent
Kawamura et al.

(10) Patent No.: US 6,767,801 B2
(45) Date of Patent: Jul. 27, 2004

(54) SIMOX SUBSTRATE AND METHOD FOR PRODUCTION THEREOF

(75) Inventors: Keisuke Kawamura, Futtsu (JP); Atsuki Matsumura, Futtsu (JP); Toshiyuki Mizutani, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 10/221,077

(22) PCT Filed: Mar. 2, 2001

(86) PCT No.: PCT/JP01/01622

§ 371 (c)(1),
(2), (4) Date: Sep. 9, 2002

(87) PCT Pub. No.: WO01/67510

PCT Pub. Date: Sep. 13, 2001

(65) Prior Publication Data

US 2003/0036289 A1 Feb. 20, 2003

(30) Foreign Application Priority Data

Mar. 10, 2000 (JP) ........................... 2000-066839
Jun. 22, 2000 (JP) ........................... 2000-188259

(51) Int. Cl.$^7$ ............................................. H01L 21/76
(52) U.S. Cl. ..................... 438/404; 438/407; 438/423; 438/769
(58) Field of Search ................... 438/404, 407, 438/423, 766, 967, 769, 770, 775

(56) References Cited

U.S. PATENT DOCUMENTS

| | | | | |
|---|---|---|---|---|
| 5,310,689 A | * | 5/1994 | Tomozane et al. | 438/765 |
| 5,534,446 A | * | 7/1996 | Tachimori et al. | 438/765 |
| 5,658,809 A | | 8/1997 | Nakashima et al. | |
| 5,707,899 A | * | 1/1998 | Cerofolini et al. | 438/407 |
| 5,918,136 A | | 6/1999 | Nakashima et al. | |
| 6,074,928 A | | 6/2000 | Ogura | |
| 6,221,743 B1 | * | 4/2001 | Fujikawa et al. | 438/530 |

FOREIGN PATENT DOCUMENTS

| | | |
|---|---|---|
| EP | 0 675 534 A2 | 10/1995 |
| EP | 0 704 892 A2 | 4/1996 |
| JP | 9-293846 | * 11/1997 |
| JP | 10-79356 | 3/1998 |
| JP | 10-223551 | 8/1998 |
| JP | 11-97377 | 4/1999 |

OTHER PUBLICATIONS

S. Nakashima and K. Izumi, Journal of Materials Research, vol. 8, 523 (1993).
S. Nakashima et al., Journal of Electrochemical Society, vol. 143, p. 244 (1996).
A. Matsummura et al., Electrical Society Proceedings, vol. 99–3, May 2–7, 1999, pp. 79–92.

* cited by examiner

Primary Examiner—Kevin M. Picardat
(74) Attorney, Agent, or Firm—Kenyon & Kenyon

(57) ABSTRACT

A SIMOX substrate having a buried oxide layer and a surface single crystal silicon layer formed therein is produced by a method which comprises implanting oxygen ions into a silicon single crystal substrate and subsequently performing a heat treatment at an elevated temperature on the substrate. The method is characterized by performing the former stage of the heat treatment at a temperature of not lower than 1150° C. and lower than the melting point of single crystal silicon in an atmosphere obtained by adding oxygen under a partial pressure of not more than 1% to an inert gas and subsequently performing at least part of the latter stage of the heat treatment by increasing the partial pressure of oxygen within a range in which no internal oxidation is suffered to occur in the buried oxide layer. It can also be prepared by performing the former stage of the high temperature heat treatment at a temperature of not lower than 1150° C. and lower than the melting point of silicon under in inert gas atmosphere containing not more than 1 vol.% of oxygen and performing ITOX treatment of the buried oxide layer at a temperature of not more than 1300° C.

8 Claims, 5 Drawing Sheets

AFTER COMPLETION OF
ANNEAL LATTER STAGE
( ITOX TREATMENT )

SIMOX SUBSTRATE AND METHOD FOR PRODUCTION THEREOF

TECHNICAL FIELD

This invention relates to a SOI substrate having a buried oxide layer disposed near the surface of a silicon substrate and a single crystal silicon layer [hereinafter referred to as "SOI (silicon-on-insulator) layer"] superposed thereon. More particularly, it relates to a SOI substrate obtained by the SIMOX (Separation by IMplanted OXygen) technology and a method for the production thereof.

BACKGROUND ART

As the SOI substrate having a single crystal silicon layer formed on such an insulation material as silicon oxide, SIMOX wafers and bonded wafers have been mainly known. The SIMOX wafer is a SOI substrate which is obtained by implanting oxygen ions into the interior of a single crystal silicon substrate and subsequently performing an annealing treatment on the substrate thereby inducing a chemical reaction between the oxygen ions and the silicon atoms in the substrate and consequently giving rise to a buried oxide (BOX) layer in the substrate. The bonded wafer is a SOI substrate which is obtained by joining two single crystal silicon wafers across an interposed oxide layer and then transforming either of the two wafers into a thin film.

The MOSFET (Metal-Oxide-Semiconductor Field Effect Transistor) which is formed in the SOI layer of such a SOI substrate is capable of repressing the short channel effect which becomes more severe as design rule of device fabrication process becomes smaller, and allowing a saving in the power consumption involved in the operation thereof in addition to excelling in radiation hardened characteristics and avoidance of latchup and exhibiting high reliability. Further, it is capable of exalting the signal transmission speed and realizing high speed operation of the device because the operating region of the device is electrically isolated from the substrate itself. By this reason, the SOI substrate acquires a prospect of becoming a high-performance semiconductor substrate for the application of MOS-LSI in the next generation.

Among other species of the SOI substrate, the SIMOX wafer possesses the characteristic feature of particularly excelling in the uniformity of thickness of the SOI layer. In the SIMOX wafer, the SOI layer can be formed in a thickness of not more than 0.3 µm and also the SOI layer having a thickness in the neighborhood of or even not more than 0.1 µm can be controlled satisfactorily in thickness. Particularly, the SOI layer measuring not more than 0.1 µm in thickness is often utilized in the formation a MOS-LSI adapted for the fully depleted type operation. Since, in this case, the thickness of the SOI layer itself has proportionality with the threshold voltage of the MOSFET operation, the uniformity in thickness of the SOI layer constitutes itself an important factor for the manufacture of a high-performance device in a high yield. From this point of view, the SIMOX wafer which excels in the uniformity of thickness of the SOI layer acquires a bright prospect of becoming a substrate for use in the MOSFET of the next generation.

In the manufacture of a SIMOX substrate, the implantation of oxygen ions is generally effected by the use of a single accelerating energy, typically an energy approximating closely to 200 keV. It is well known that, in this case, only when the amount of oxygen ions to be implanted is either in a region of not less than $1.5 \times 10^{18}$ pieces/cm$^2$ or in a limited region in the range of $2.5$–$4.5 \times 10^{17}$ pieces/cm$^2$, the SIMOX structure obtained after a heat treatment at an elevated temperature is enabled to acquire a buried oxide layer of satisfactory continuous and uniform quality (as disclosed in S. Nakashima and K. Izumi, Journal of Materials Research, Vol. 8, 523 (1993), for example). As respects these species of SIMOX substrate that are manufactured by implanting oxygen ions in such amounts as mentioned above, it is customary to designate the species of SIMOX manufactured by implanting oxygen ions in an amount in the former range as high-dose SIMOX substrates and the species of SIMOX manufactured by implanting oxygen ions in an amount in the latter range as low-dose SIMOX substrates.

The high-dose SIMOX substrates and the low-dose SIMOX substrates respectively possess specific characteristics of their own and find utility in particular applications which are appropriate for these specific characteristics. Of these species, the low-dose SIMOX substrates acquire a prospect of decreasing the threading dislocation density in the surface silicon layer and realizing low production cost as well because the amount of oxygen ions to be implanted therein is comparatively small. The low-dose SIMOX substrates meanwhile have the problem of leak defects generation in the buried oxide layer and insulation resistance deficiency with a high probability because of the small thickness of the buried oxide layer.

As a measure to contribute to the improvement of the quality of the buried oxide layer of the low-dose SIMOX substrate, the internal thermal oxidation process (hereinafter referred to as an "ITOX process") has been proposed (U.S. Pat. No. 5,658,809 and U.S. Pat. No. 5,918,136 or S. Nakashima et al., Journal of Electrochemical Society, Vol. 143, page 244 (1996)). According to the ITOX process, the treatment of oxidation at an elevated temperature induces growth of a thermal oxide film on the surface of a substrate and growth of an oxide film in a certain amount on the upper interface of a buried oxide film as well and consequently renders addition to the thickness of a buried oxide film possible. It is reported that this process produces the consequence of feasibilizing both the repression of leak defects and the improvement in insulation resistance in the buried oxide layer.

The surface silicon layer in the low-dose SIMOX substrate still contains threading dislocations at a density in the approximate range of $10^2$–$10^4$ pieces/cm$^2$ or in a higher range, though repressed as compared with the high-dose SIMOX substrate. It has been pointed out that when the ITOX treatment (internal oxidation treatment) is carried out at a generally adopted elevated temperature of about 1350° C. in the process for the production of such a low-dose SIMOX substrate, depressions measuring approximately 2 µm in diameter and 10 nm in depth and centering around the sites of threading dislocations are generated on the surface of the SOI layer (W. P. Maszara et al., Proceedings 1997 IEEE International SOI Conference, page 18). Typically, the fully depleted type device using a SOI of a thickness of not more than 100 nm has the threshold voltage of its operation vary with the thickness of the SOI layer. Since the depressions mentioned above affect the local variation of the SOI thickness, the fully depleted type device which is manufactured on such a substrate has the possibility of imposing a restriction on the performance of operation thereof.

In the ITOX technique mentioned above, since the effect of the internal oxidation which is relied on to produce an increment in the thickness of the buried oxide film induces growth of a surface oxide film in a thickness of not less than 10 times the increment in the buried oxide film, the surface silicon layer inevitably has the thickness thereof decrease. An effort to secure an increment in the buried oxide film owing to the effect of internal oxidation for the purpose of improving the quality of the buried oxide layer has no alternative but to decrease the thickness of the surface silicon layer, with the result that the produced silicon layer will impose a restriction on the thickness thereof. Otherwise, an effort to secure a prescribed surface silicon layer in the eventually produced SIMOX structure entails the necessity for limiting the amount of an oxide on the surface of the substrate, with the result that the degree with which the buried oxide layer is improved in quality will have its own limit.

The low-dose SIMOX substrate manufactured by the use of the ITOX process, though improved in the quality of the buried oxide layer by the ITOX effect as described above, suffers generation of depressions approximately measuring 2 $\mu$m in diameter and 10 nm in depth at the sites of threading dislocations which persist in the surface silicon layer. When a fully depleted type device using a SOI layer of a small thickness typically not more than 100 nm is formed on such a substrate, therefore, the device entails the problem of possibly imposing a restriction on the improvement of the performance of its operation because the threshold voltage of operation thereof is affected by the local variation of the thickness of the SOI layer.

This invention, by repressing in the conditions for the thermal treatment performed in the method for producing a SIMOX substrate the oxygen concentration in the ambient air to the extent of preventing the ITOX effect from manifesting, makes it possible to moderate the aforementioned restriction on the conventional ITOX, lessen the leak defects in the buried oxide layer, and allow provision of a SIMOX substrate of higher quality.

Further, this invention, by elaborately defining the conditions for the thermal treatment involved in the method for producing a SIMOX substrate, makes it possible to overcome the problems encountered by the conventional ITOX and allow provision of a SIMOX substrate of higher quality and a method for the production thereof.

DISCLOSURE OF THE INVENTION

The objects mentioned above are accomplished by the following items (1)–(20).

(1) A method for the production of a SIMOX substrate having a buried oxide layer and a surface single crystal silicon layer formed therein by implanting oxygen ions into a silicon single crystal substrate and subsequently performing a heat treatment at an elevated temperature on the substrate, which method is characterized by performing the former stage of the heat treatment at a temperature of not lower than 1150° C. and lower than the melting point of single crystal silicon in an atmosphere obtained by adding oxygen under a partial pressure of not more than 1% to an inert gas and subsequently performing at least part of the latter stage of the heat treatment by increasing the partial pressure of oxygen within a range in which no internal oxidation is suffered to occur in the buried oxide layer.

(2) A method set forth in (1) above, wherein the temperature of the latter stage of the heat treatment is not lower than 1150° C. and falls short of the melting point of single crystal silicon.

(3) A method set forth in (1) above, wherein the temperatures respectively of the former stage and the latter stage of the heat treatment are each not lower than 1300° C. and fall short of the melting point of the single crystal silicon.

(4) A method set forth in (1) above, wherein at least part of the latter stage of the heat treatment is performed in an atmosphere formed by adding oxygen under a partial pressure in the range of 1–10% to an inert gas.

(5) A method set forth in (1) above, wherein the temperatures respectively of the former stage and the latter stage of the heat treatment are each not lower than 1350° C. and falls short of the melting point of the single crystal silicon, and at least part of the latter stage of the heat treatment is performed in an atmosphere formed by adding oxygen under a partial pressure in the range of 1–10% to an inert gas.

(6) A method for the production of a SIMOX substrate having a buried oxide layer and a surface single crystal silicon layer formed therein by implanting oxygen ions into a silicon single crystal substrate and subsequently performing a heat treatment at an elevated temperature on the substrate, which method is characterized by performing the former stage of the heat treatment at a temperature of not lower than 1150° C. and lower than the melting point of single crystal silicon in an atmosphere obtained by adding oxygen under a partial pressure of not more than 1% to an inert gas and subsequently performing at least part of the latter stage of the heat treatment at a temperature of not higher than 1300° C. so as to induce an internal oxidation in the buried oxide layer.

(7) A method set forth in (6) above, wherein the temperature of the former stage of the heat treatment is not lower than 1300° C. and falls short of the melting point of the single crystal silicon.

(8) A method set forth in (6) above, wherein the temperature of the treatment for internal oxidation is in the range of 1150°–1280° C.

(9) A method set forth in (6) above, wherein the temperature of the treatment for internal oxidation is in the range of 1150°–1250° C.

(10) A method set forth in (6) above, wherein the partial pressure of oxygen in the treatment for internal oxidation is not lower than 50%.

(11) A method set forth in (6) above, wherein the temperature of the former stage of the heat treatment is not lower than 1300° C., the temperature of the subsequent treatment for internal oxidation is in the range of 1150°–1280° C., and the partial pressure of oxygen is not lower than 50%.

(12) A method for the production of a SIMOX substrate having a buried oxide layer and a surface single crystal silicon layer formed therein by implanting oxygen ions into a silicon single crystal substrate and subsequently performing a heat treatment at an elevated temperature on the substrate, which method is characterized by performing the former stage of the heat treatment at a temperature of not lower than 1150° C. and lower than the melting point of single crystal silicon in an atmosphere obtained by adding oxygen under a partial pressure of not more than 1% to an inert gas, subsequently performing a heat treatment by increasing the partial pressure of oxygen in a range in which the buried oxide layer is not allowed to induce internal oxidation, and thereafter using, during the generation of internal oxidation in the buried oxide layer induced by increasing the partial pressure of oxygen and performing a heat treatment, a temperature of not higher than 1300° C.

(13) A method set forth in (12) above, wherein the temperatures respectively of the former stage of the heat treatment and the subsequent heat treatment are each not lower than 1300° C. and fall short of the melting point of the single crystal silicon.

(14) A method set forth in (12) above, wherein the temperature of the treatment for internal oxidation is in the range of 1150°–1280° C.

(15) A method set forth in (12) above, wherein the temperature of the treatment for internal oxidation is in the range of 1150°–1250° C.

(16) A method set forth in (12) above, wherein the partial pressure of oxygen in the treatment for internal oxidation is not lower than 50%.

(17) A method set forth in (12) above, wherein the temperatures respectively of the former stage of the heat treatment and the subsequent heat treatment are each not lower than 1300° C. and lower than the melting point of the single crystal silicon, the temperature of the subsequent treatment for internal oxidation is in the range of 1150°–1280° C., and the partial pressure of oxygen is not lower than 50%.

(18) A method set forth in (12) above, wherein the temperatures respectively of the former stage of the heat treatment and the subsequent heat treatment are each not lower than 1300° C. and lower than the melting point of the single crystal silicon, the temperature of the subsequent treatment for internal oxidation is in the range of 1150°–1250° C., and the partial pressure of oxygen is not lower than 50%.

(19) A SIMOX substrate produced by a method set forth in any of (1)–(18) above.

(20) A SIMOX substrate comprising a surface single crystal silicon layer having a thickness in the range of 10–120 nm and a buried oxide layer having a thickness in the range of 80–200 nm and characterized by the undulation of the surface of the substrate having an amplitude of not more than 8 nm.

In the present invention, in the heat treatment carried out subsequent to the heat treatment of the first step, the treatment is carried out under the condition increasing the partial pressure in the range that ITOX effect does not generate than that of the first step. Although the ITOX effect does not generate under such condition, in other words although thickness of the buried oxide layer does not increase, the leak defects of the buried oxide layer decrease along with the treatment time. On the other hand, in this process, comparing with the conventional ITOX process wherein not less than 30% of the oxygen partial pressure, lower oxygen partial pressure atmosphere is used, so growth of surface oxide film during the heat treatment is surpressed compared to the conventional ITOX treatment process. Therefore, it becomes possible to maintain that longer heat treatment time until reaching the desired thickness of silicon layer, and as a result, it becomes possible to decrease further leak defects of the buried oxide layer.

BEST MODE OF EMBODYING THE INVENTION

Now, the mode of embodying this invention will be described below.

In the method for producing a SIMOX substrate by implanting oxygen ions into a single crystal silicon substrate and subsequently performing a heat treatment at an elevated temperature on the silicon substrate, this invention relates to the conditions for the heat treatment at the elevated temperature. The former stage of the heat treatment at the elevated temperature is performed in an atmosphere obtained by adding oxygen in a trace amount under a partial pressure of not higher than 1% to an inert gas and the latter stage of the heat treatment is subsequently effected by increasing the partial pressure of oxygen within a range in which no ITOX effect is suffered to occur. Otherwise, in this invention, the former stage of the heat treatment at an elevated temperature mentioned above is performed in an atmosphere obtained by adding a trace amount of oxygen under a partial pressure of not higher than 1% to an inert gas and the ITOX treatment is subsequently performed at a temperature of not higher than 1300° C. Still otherwise, in this invention, the initial stage of the heat treatment at an elevated temperature mentioned above is performed in an atmosphere obtained by adding a trace amount of oxygen under a partial pressure of not higher than 1% to an inert gas, then a heat treatment is performed by increasing the partial pressure of oxygen within a range in which no ITOX effect is suffered to occur, and subsequently the ITOX treatment is performed at a temperature of not higher than 1300° C.

The temperature of the heat treatment in the former stage is preferred for the purpose of healing the damage done by the implantation of oxygen ions to be not lower than 1300° C. and lower than the melting point of single crystal silicon. More preferably, the temperature is not lower than 1350° C. and lower than the melting point of the single crystal silicon. As typical examples of the inert gas, argon and nitrogen may be cited. The inert gas does not need to be particularly discriminated but is only required to be inert in nature. The duration of the treatment of interest does not need to be particularly discriminated but is only required to allow thorough restoration from the damage caused in the crystal. The duration to be typically used is in the approximate range of 1 to 6 hours.

The atmosphere for the former stage of the heat treatment prefers addition thereto of a trace amount of oxygen from the viewpoint of preventing the surface of the silicon layer from coarsening. The damage brought on by the implantation of oxygen ions is healed during the former stage of the heat treatment. If the partial pressure of the oxygen to be added is excessively increased, the oxygen precipitates will be inevitably formed with the damaged portion as the core before the damage is healed and, consequently, the plan to form a satisfactory SIMOX structure will fail. For the purpose of precluding the formation of this oxygen precipitates, it is necessary to decrease the amount of oxygen to be added to the irreducible minimum. Preferably, it is decreased to below 1%.

The partial pressure of the oxygen in the latter stage of the heat treatment effected by increasing the concentration of oxygen subsequently to the former stage of the heat treatment is only required to be within a range in which no ITOX effect is suffered to occur. For the purpose of deriving the largest possible effect from the repression of leak defects during a fixed duration of treatment, it is commendable to heighten the concentration of oxygen. From the viewpoint of securing a prescribed duration of treatment, it is commendable to avoid heightening the concentration of oxygen excessively on account of the necessity for repressing the speed of surface oxidation. In order to reconcile these two viewpoints, the treatment is preferred to be performed under the partial pressure of oxygen in the range of 1–10%. The temperature of the treatment is properly set at a high level for the purpose of decreasing leak defects. It is preferably not lower than 1300° C. and lower than the melting point of the single crystal silicon and more preferably not lower than 1350° C. and lower than the melting point of the single crystal silicon. Though the duration of the treatment is only required to allow formation of a surface silicon layer of a prescribed thickness, the effect of this invention is increased in accordance as the duration of the treatment is elongated. Though the duration of treatment is properly not less than four hours from the viewpoint of the effect thereof, it is commendable to set the upper limit of the duration of treatment in the neighborhood of 20 hours from the viewpoint of the economy of the heat treatment.

The temperature of the ITOX treatment is required to be not lower than 1150° C. for the purpose of producing an increment in the upper interface of the buried oxide film. Then, for the purpose of repressing the generation of depressions around the sites of dislocation on the surface of the silicon layer, this temperature is required to be not higher than 1300° C. It is more preferably not higher than 1280° C. and still more preferably not higher than 1250° C. The success in repressing the generation of depressions around the sites of dislocation owing to the use of the temperature specified above may be logically explained by supposing the following mechanism. Specifically, in the ITOX treatment at 1350° C., the reaction of oxidation in the interface between the surface oxide film and the silicon layer forms the so-called reaction-rate limited step because the oxygen to be diffused through the surface of the substrate into the interior thereof can be secured in a fully sufficient amount. At the sites allowing the presence of penetration dislocations, locally accelerated oxidation is generated at the sites of dislocation under the reaction-rate limited condition and local depressions are consequently generated in the silicon layer at the relevant parts on account of the presence of high-index crystal plane of a high reaction rate constant. When the temperature of the ITOX treatment is lowered from 1350° C., the reaction of oxidation in the interface between the surface oxide film and the silicon layer is shifted from the reaction-rate limited process to the diffusion-rate limited process because the amount of oxygen diffused through the surface to the interior is decreased in accordance as the temperature of the treatment is lowered. When the reaction of oxidation is shifted to the diffusion-rate limited process, since the rate of the reaction is uniquely fixed not by the reaction constant in the interface being oxidized but by the feed volume of oxygen, the accelerated oxidation at the parts of dislocation which would occur during the reaction-rate limited process is no longer generated and, as a result, the local depressions in the silicon layer are repressed. In order for the reaction in the interface of oxidation to be governed by the feed rate of oxygen, the temperature of the ITOX treatment is lowered properly to 1280° C. and preferably to 1250° C.

The partial pressure of oxygen in the ITOX treatment does not need to be particularly restricted but is only required to be in a range in which the ITOX effect is attained. From the viewpoint of curtailing the duration of treatment, the partial pressure of oxygen is commended to be so high as to fall preferably in the range of 30–100 vol. %, and more preferably in the range of 50–100 vol. %. Where the partial pressure of oxygen is less than 100 vol. %, the gas with which the oxygen is mixed may be an inert gas. As typical examples of the inert gas, argon and nitrogen may be cited, though not exclusively.

The duration of the ITOX treatment is adjusted so as to obtain eventually a SOI layer of a stated thickness. It cannot be generally specified because it is variable with the temperature of ITOX treatment. When the thickness of the SOI layer is in the typically adopted range of 50–200 nm, the duration of the ITOX treatment is in the approximate range of 3–8 hours, though not exclusively.

The condition for the implantation of oxygen ions in the production of the SIMOX substrate according to this invention does not need to be particularly limited. The dose of oxygen ions can be in the low dose range or the high dose range or otherwise, whichever may suit the occasion best. From the viewpoint of decreasing leak defects, the condition of heat treatment contemplated by this invention is expected to bring a large effect when it is adopted where the low dose which is liable to generate leak defects is in use. As regards the condition for the low-dose implantation, typically the dose is in the range of $2.5 \times 10^{17}$ cm$^{-2}$–$4.5 \times 10^{17}$ cm$^{-2}$ when the acceleration energy to be used is 180 keV. The implantation of oxygen ions may be carried out to a plurality of repetitions.

From the viewpoint of decreasing the crystal defects in the SOI layer, the temperature of the substrate during the implantations of ions is preferably in the approximate range of 500°–600° C.

The apparatus for use in the heat treatment at an elevated temperature does not need to be particularly limited but is only required to be capable of performing the heat treatment at a stated temperature for a stated period of time. As the apparatus which is used advantageously, typically the high-temperature heat-treating furnace may be cited. The lamp anneal furnace is capable of performing this treatment so long as it satisfies such factors as the temperature of treatment and the duration of treatment. As respects the conditions for the operation of the heat-treating furnace other than the temperature of treatment and the duration of treatment, the temperature of insertion, the temperature-increasing speed, the temperature-decreasing speed, etc. do not need to be particularly discriminated. The increase of temperature and the decrease of temperature may be each carried out as split into a plurality of stages.

In accordance with the first aspect of this invention, when the accelerating voltage to be used for the implantation of oxygen ions is 180 keV, for example, the SIMOX substrate which is produced in a construction comprising a surface silicon layer of a thickness of not less than 200 nm and a buried oxide layer of a thickness of not more than 90 nm is enabled to decrease the density of leak defects from the heretofore normal level of not less than one piece/cm$^2$ to not more than one piece/cm$^2$. Even in this case, the thickness of the surface silicon layer can be easily decreased to below 200 nm by subsequently performing an ITOX treatment or such an oxidizing treatment as the sacrifice oxidizing treatment or an etching treatment using a liquid chemical reagent or reactive ion etching method.

In accordance with the second aspect of this invention, when the low-dose SIMOX substrate is produced by using an ion-implanter adapted to operate with an acceleration energy in the range of 150–250 keV and typically adopted for the production of a SIMOX substrate, the SOI layer of a thickness of not more than 120 nm which is required in the manufacture of the electric field effect transistors fit for fully depleted type operation can be produced on the buried oxide layer having the quality improved by the ITOX treatment and having a thickness in the range of 80–200 nm, with the amplitude of the undulation of surface restrained to below 8 nm. In the fully depleted type operation, the threshold voltage varies with the thickness of the SOI layer. At the popularly adopted SOI layer thickness in the range of 50–120 nm, the change of 1 nm in thickness produces a change of 10 mV in the threshold voltage. Since the typical threshold voltage in the fully depleted type operation using the SIMOX substrate is 400 mV and the variation thereof is tolerated in the approximate range of 20%, it is commendable to repress the variation of the thickness of the SOI layer to below 8 nm. Since the SIMOX substrate contemplated by this invention restrains the local undulation of the SOI layer to below 8 nm, the electric field effect transistor element of the fully depleted type operation which is superposed on the SOI layer is enabled to realize a threshold voltage with repressed dispersion.

The third aspect of this invention combines the first aspect and the second aspect of this invention and enables the respective effects thereof to be realized in a combined state. It goes without saying that the first aspect of this invention and the second aspect of this invention do not need to be executed in a combined state but may be implemented independently of each other.

Now, the working examples of the first aspect of this invention and the second aspect of this invention will be specifically described below. Since the third aspect of this invention combines the first aspect of this invention with the second aspect of this invention and the effect thereof is the sum of the respective effects of the two aspects of the invention, this third aspect of the invention will be omitted from the following specific description.

First Mode of Embodiment

Figure 1A:
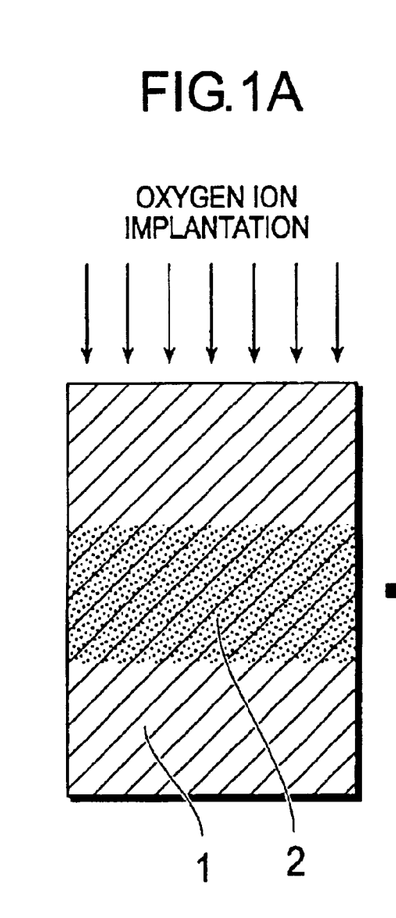
FIGS. 1A, 1B and 1C are a diagram illustrating in type section the manner of change of the cross-sectional structure of a SIMOX substrate in the process of this invention for the production of the SIMOX substrate.
Figure 1B:
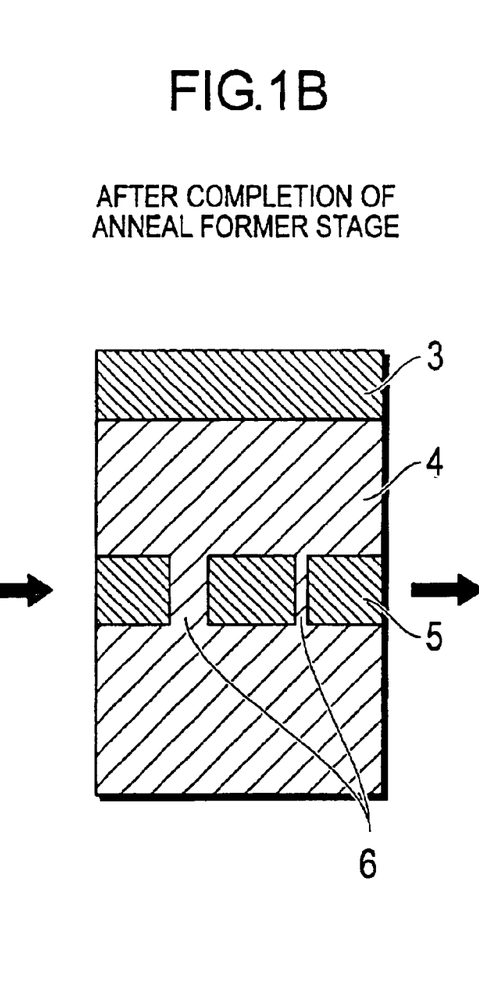
Figure 1C:
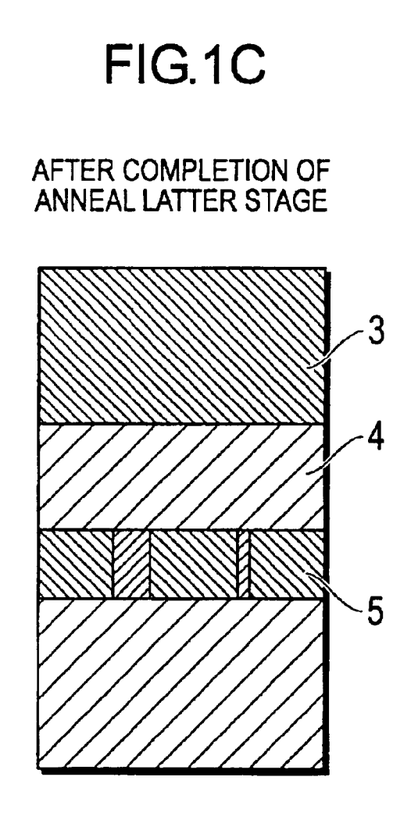
Figure 2A:
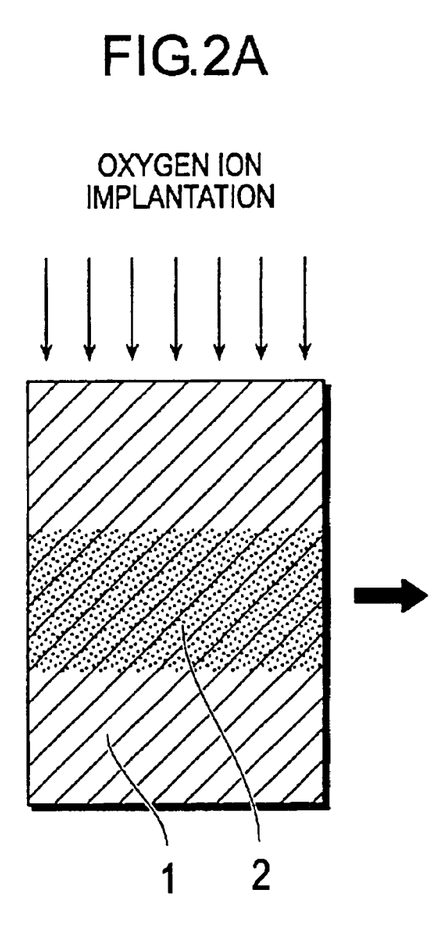
FIGS. 2A, 2B and 2C are a diagram illustrating in type section the manner of change of the cross-sectional structure of a SIMOX substrate in the process of the conventional ITOX technique for the production of the SIMOX substrate.
Figure 2B:
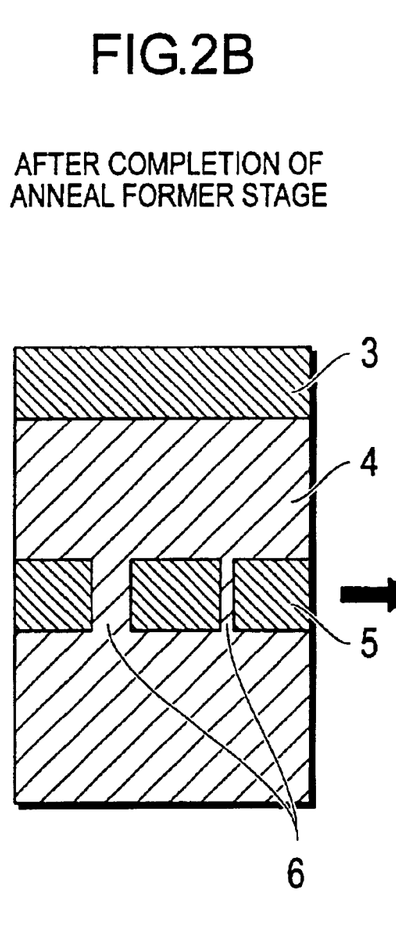
Figure 2C:
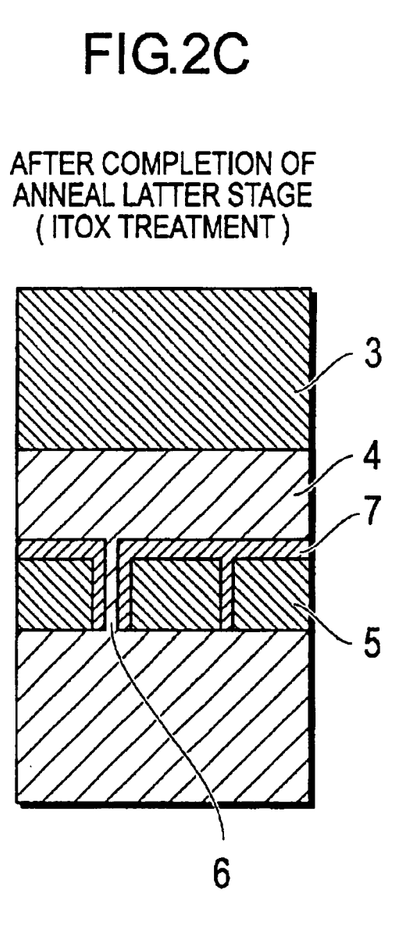

Nine silicon wafers 1 were prepared. Oxygen ions were implanted in the region 2 in each of the silicon wafers under the conditions of 550° C. of substrate temperature, 180 keV of acceleration voltage, and $4 \times 10^{17}$ cm$^2$ of ion dose (refer to FIG. 1A and FIG. 2A). Then, these wafers 1 were severally placed in a heat-treating furnace and subjected therein to a high-temperature heat treatment under varying conditions. The high-temperature heat-treatment was performed as split in two steps. At the first step, common conditions, i.e., 1350° C. of temperature, argon+0.5% oxygen of atmosphere, and 4 hours of duration of treatment, were used for all the wafers to form a surface oxide film 3 on the surface of a surface silicon layer 4 and a buried oxide layer 5 in the silicon wafer (refer to FIG. 1B and FIG. 2B). In this case, leak defects 6 were partially generated in the buried oxide layer. At the second step, a fixed temperature of 1350° C. was used and the atmosphere and the duration of treatment were varied in the wafers. The heat treatment was performed for 8 hours in the atmosphere having the partial pressure of the oxygen added to argon varied in the range of 1–10% (Examples 1–5) (refer to FIG. 1C). As controls, samples were manufactured in the case of omitting the second step and completing the heat treatment within the first step (Control 1), the case of performing the treatment of the second step for 8 hours with the partial pressure of the oxygen fixed at 0.5% (Control 2), the case of performing the treatment of the second step for 8 hours with the partial pressure of the oxygen fixed at 20% (Control 3), and the case of performing the treatment of the second step for 4 hours with the partial pressure of the oxygen fixed at 50% (Control 4) (refer to FIG. 2C).

The SIMOX wafers consequently manufactured were stripped of a surface oxide layer with hydrofluoric acid. In each of the wafers, the surface silicon layer and the buried oxide layer were measured for thickness by means of spectroscopic ellipsometry. The thickness of silicon layer in each of the samples is shown in Table 1. The thickness varied from 340 nm to 170 nm, depending on the conditions used at the second step. The BOX layer thickness was found to be 85 nm in Control 1. In the other samples, the amounts of ITOX were calculated as differences from the BOX layer thickness of Control 1 and are reported in Table 1. In Control 2 and Examples 1–5, the thicknesses of the BOX layer in the relevant samples were not found to differ from the thickness in the sample of Control 1. This fact supports a conclusion that none of these samples generated ITOX. In the samples of Controls 3 and 4, the generation of ITOX in the respective amounts of 6 nm and 20 nm were recognized (refer to FIG. 2C with respect to the buried oxide part formed by ITOX).

Thereafter, the leak defects in the BOX layer of each of the samples were rated by the copper electrodeposition analysis. A given sample was immersed in a plating solution containing copper ions in such a manner that only the surface of the substrate touched the solution, with the rear side of the substrate held in contact with an electric cathode and an electric anode disposed in the plating solution. By applying a low voltage of about 10 V, a magnitude incapable of breaking the BOX layer itself, between the opposite electrodes, the deposit of copper was generated on the surface of the substrate directly above the portions containing leak defects in the BOX layer. By taking count of these sites of copper deposition, the density of leak defects in the BOX layer was rated. The ratio of generation of leak defects was calculated by dividing the density of leak defects thus obtained by the density of particles and extraneous substance generated on the surface during the implantation of oxygen ions. The ratios of leak defect generation are shown in Table 1 as numerical values relative to Control 1. In Control 2 which performed the treatment for 8 hours with the partial pressure of oxygen fixed at 0.5, the relative value of the ratio of leak defect generation was found to be 0.9, a magnitude representing no appreciable decrease in the density of leak defects in the BOX layer as compared with Control 1. In Example 1 which performed the treatment for 8 hours with the partial pressure of oxygen fixed at 1%, the relative value of the ratio of leak defect generation was found to be 0.75, a magnitude indicating the manifestation of an effect of the treatment. In Example 2 which performed the treatment for 8 hours with the partial pressure of oxygen fixed at 2%, the relative value of the ratio of generation of leak defects was found to be 0.65, a magnitude indicating a clear trend of decreasing the leak defects. Then, in Example 3 which performed the treatment for 8 hours with the partial pressure of oxygen increased up to 4%, the relative value of the ratio of generation of leak defects was found to be 0.5, a magnitude representing a clear decrease of leak defects. When the treatment was performed for 8 hours with the partial pressure of oxygen increased to 7% (Example 4), the relative value of the ratio of generation of leak defect was 0.4, and when the treatment was performed for 8 hours with the partial pressure of oxygen increased to 10% (Example 5), and 20% (Control 3) respectively, the relative values of the ratio of generation of leak defects were invariably found to be 0.4. In Control which performed the treatment for 4 hours with the partial pressure of oxygen increased to 50% for the purpose of preventing the silicon layer from becoming unduly thin, the relative value of the ratio of generation of leak defects was found to be 0.4.

TABLE 1

Evaluated results in working examples

| Wafer | Partial pressure of oxygen (%) | Treatment time (h) | Thickness of surface silicon layer (nm) | Amount of ITOX (nm) | Ratio of generation of leak defects in buried oxide layer (relative value) | Remarks |
| --- | --- | --- | --- | --- | --- | --- |
| A | — | — | 340 | 0 | 1.0 | Control 1 |
| B | 0.5 | 8 | 310 | 0 | 0.9 | Control 2 |
| C | 1 | 8 | 300 | 0 | 0.75 | Example 1 |
| D | 2 | 8 | 290 | 0 | 0.65 | Example 2 |
| E | 4 | 8 | 280 | 0 | 0.5 | Example 3 |
| F | 7 | 8 | 260 | 0 | 0.4 | Example 4 |
| G | 10 | 8 | 235 | 0 | 0.4 | Example 5 |
| H | 20 | 8 | 190 | 6 | 0.4 | Control 3 |
| I | 50 | 3 | 170 | 20 | 0.4 | Control 4 |

The results shown in Table 1 indicate that the leak defects in the buried oxide layer of a SIMOX wafer could be decreased by increasing the partial pressure of oxygen during the course of the high-temperature annealing treatment performed at the second step. They further indicate that the effect is amply obtained particularly by increasing the partial pressure of oxygen to above 4%. From the fact that no generation of the ITOX effect was observed at any partial pressure of oxygen up to 10%, it is inferred that the decrease in leak defects obtained by fixing the partial pressure of oxygen at the second step in a range of 1–10% is different in mechanism from the decrease of leak defects by the ITOX effect described in U.S. Pat. No. 5,658,809 and U.S. Pat. No. 5,918,136.

What is more important about the results of Table 1 is the fact that in Examples 1–5 which used the partial pressure of oxygen in the range of 1–10% at the second step, the amounts of decrease in the thickness of the surface silicon layer were repressed as compared with those obtained Controls 3 and 4 in which the effect of ITOX was generated and the effects of decreasing the leak defects in the BOX layer stood comparison those obtained in these controls. By using the method of this invention, therefore, an equal density of leak defects in the BOX layer can be realized in a SIMOX wafer having a surface silicon layer of a larger thickness and, in the SIMOX wafer possessing a surface silicon layer having a fixed thickness, the leak defects in the BOX layer can be decreased to a greater extent.

Second Mode of Embodiment

Seven silicon wafers were prepared. Oxygen ions were implanted into each of the silicon wafers under the conditions of 550° C. of substrate temperature, 180 keV of acceleration voltage, and $4\times10^{17}$ $cm^{-2}$ of ion dose. Then, these wafers were severally placed in a heat-treating furnace and subjected therein to high-temperature heat treatment under varying conditions. The high-temperature heat treatment was performed as split into two steps. At the first step, all the wafers were treated under invariable conditions of 1350° C. of temperature, argon+0.5 vol. % of oxygen of atmosphere, and 4 hours of duration of treatment. At the second step which formed the so-called ITOX process of treatment, the samples were treated in an atmosphere formed by adding 70 vol. % of oxygen to argon, with the temperature severally varied in the range of 1100°–1350°. The duration of the treatment at each temperature was so adjusted as to give a fixed thickness of 100 nm to the eventually obtained silicon layer.

The SIMOX wafers consequently manufactured were stripped of a surface oxide layer with hydrofluoric acid. Then, the surface silicon layer and the BOX layer in each of the wafers were measured for thickness by means of spectral ellipsometry. The thickness of the silicon layer was invariably 100 nm in all the samples because the duration of heat treatment was adjusted as described above. The thickness of the BOX layer assumed a value varying with the temperature of treatment. The amount of ITOX was calculated as the difference from the thickness of the BOX layer which was 85 nm when the ITOX treatment was omitted.

Figure 3:
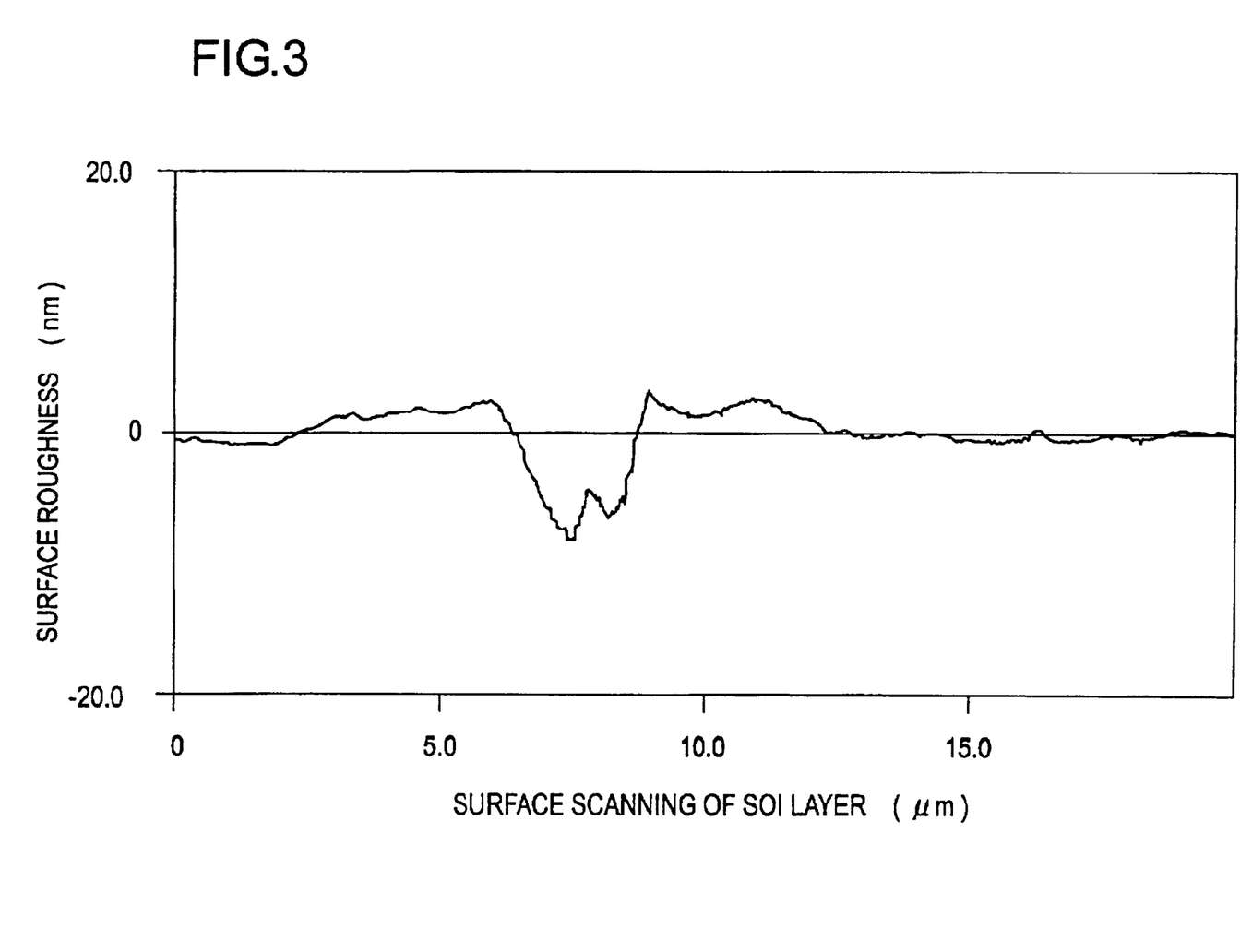
FIG. 3 is a typical observation of the profile of the surface of a SOI layer in a sample using an ITOX temperature of 1350° C.
Figure 4:
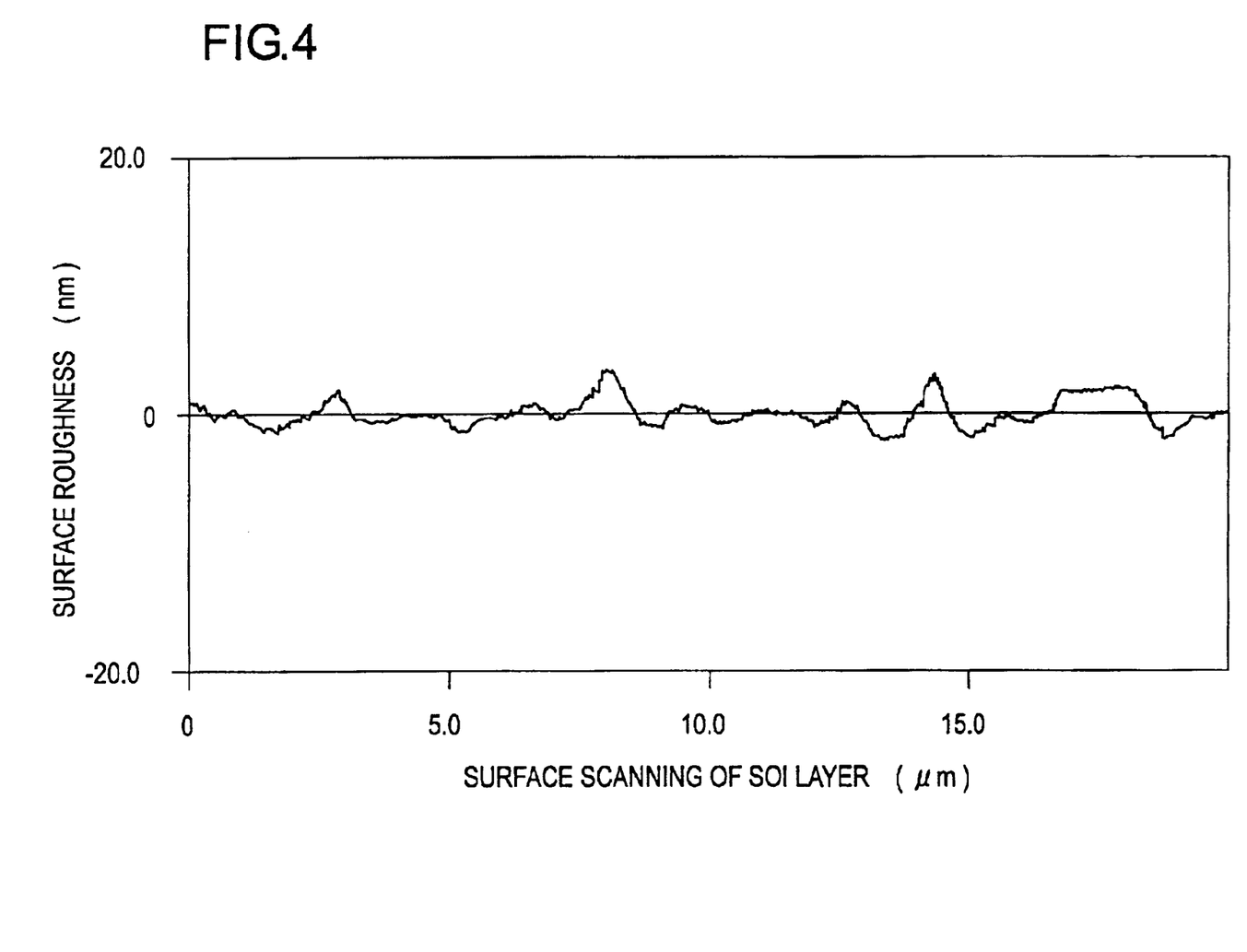
FIG. 4 is a typical observation of the profile of the surface of a SOI layer in a sample using an ITOX temperature of 1250° C.

Thereafter, the surface of the SOI layer in each sample was observed with the aid of an atomic force microscope (made by Digital Instruments Corp. and sold under the product code of "D-5000") to rate the irregularity thereof. FIG. 3 depicts the example of observation of the profile of the surface of SOI layer in the sample using the ITOX temperature of 1350° C. and FIG. 4 the example of observation of the profile of the surface of SOI layer in the sample using the ITOX temperature of 1250° C. In FIG. 3, a local depression is discerned and is found from the profile to have a depth of about 12 nm. In FIG. 4, roughness is observed throughout the length of the profile but no local depression is discerned. These samples were etched with a solution obtained by mixing hydrofluoric acid and chromic acid at a ratio of 2:1 till ½ of the SOI layer was removed. When the wafer surfaces consequently exposed in the sample by the etching were observed with the aid of an optical microscope, the local depression shown in FIG. 3 was found to correspond to the site of threading dislocation in the silicon layer. Since the sample corresponding to FIG. 4 likewise shows a clear sign of the presence of threading dislocation, it is concluded that the generation of a depression at the site of threading dislocation is absent from the surface of the silicon layer depicted in FIG. 4. Since the roughness of the surface of the silicon layer observed in FIG. 4 is equivalent to the roughness of the interface between the silicon layer and the BOX layer, it is concluded that this surface roughness has resulted from the projection of the interface roughness and has not affected the thickness of the silicon layer.

Figure 5:
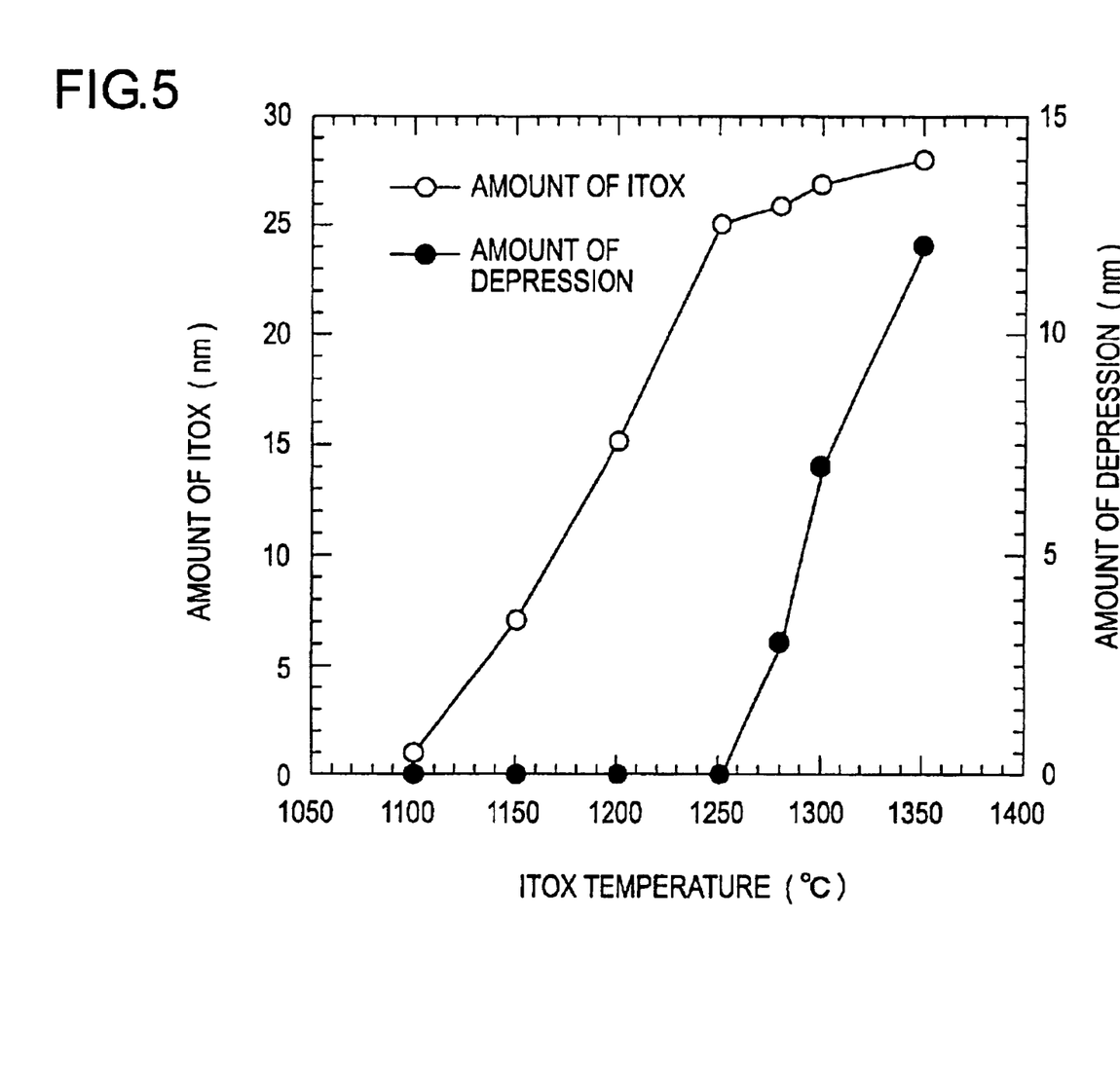
FIG. 5 is the result of a rating of a working example of this invention in the second mode of embodiment.

The seven samples which used varying ITOX temperatures were severally tested for ITOX temperature, amount of ITOX, and depth of a depression on the surface of a silicon layer to find the relation. The results are shown in FIG. 5.

The depth of the depression on the surface of the silicon layer was decreased in accordance as the ITOX temperature was lowered. Though the depth which was 12 nm at 1350° C. decreased to 7 nm at 1300° C. and to 3 nm at 1280° C., absolutely no depression was found to occur below 1250° C. The amount of ITOX was likewise decreased in accordance as the temperature of the ITOX treatment was lowered. Though the amount of ITOX which was 28 nm at 1350° C. was barely decreased gradually to 25 nm at 1250° C., it was still 15 nm at 1200° C. and 7 nm at 1150° C. At 1100° C., the amount of ITOX was not more than 1 nm, indicating the absence of the effect of the treatment. These results support a conclusion that although the effect of ITOX persists till the temperature is lowered to 1150° C., the depression on the surface of the silicon layer can be completely avoided at any temperature of the heat treatment below 1250° C.

The tolerance of this local depression is presumed to vary with the kind of a device to be fabricated on the SIMOX substrate and the fabrication process for the device. As one index for the tolerance, the dispersion of the thickness of the silicon layer is claimed to fall within ±5% (the value specified in the 1999 NTSR Load Map). Since the substrate furnished with a thin SOI layer is used for the fully depleted type device, the demand imposed as to the dispersion of SOI layer thickness becomes rigid. In the case of the typical thickness, 100 nm, of the silicon layer, the dispersion of this thickness must be repressed within ±5 nm. Further, from the viewpoint of the variation of the threshold voltage in the fully depleted type operation, the dispersion of the thickness of the silicon layer is expected to be restrained within the difference of 8 nm between the maximum and the minimum as already described above. This invention is enabled by using an ITOX temperature of not higher than 1300° C. to fulfill this requirement. For more infallible fulfillment of this requirement, it is commendable to use a temperature of not higher than 1280° C. The use of a temperature of not higher than 1250° C. is appropriate for the purpose of perfectly avoiding the effect of this local depression.

Industrial Applicability

As described above, this invention makes it possible by defining the condition of the partial pressure of oxygen and the condition of temperature at the step of high-temperature heat treatment in the process for the production of the SIMOX substrate to repress the leak defects in the buried oxide film, decrease the local depression on the surface of silicon layer, and realize a SIMOX substrate excelling in characteristic properties.

What is claimed is:

1. A method for the production of a SIMOX substrate having a buried oxide layer and a surface single crystal silicon layer formed therein by implanting oxygen ions into a silicon single crystal substrate and subsequently performing a heat treatment at an elevated temperature on said substrate, which method is characterized by performing a former stage of said heat treatment at a temperature of not lower than 1150° C. and lower than the melting point of single crystal silicon in an atmosphere obtained by adding oxygen under a partial pressure of not more than 1% to an inert gas, subsequently performing a second heat treatment by increasing the partial pressure of oxygen in a range in which the buried oxide layer is not allowed to induce internal oxidation, and thereafter using, during the generation of internal oxidation in said buried oxide layer induced by increasing the partial pressure of oxygen and performing a third heat treatment, a temperature of not higher than 1300° C.

2. A method according to claim 1, wherein the temperatures respectively of the former stage of said heat treatment and the second heat treatment are each not lower than 1300° C. and fall short of the melting point of the single crystal silicon.

3. A method according to claim 1, wherein the temperature to induce the internal oxidation is in the range of 1150°–1250° C.

4. A method according to claim 1, wherein the temperature to induce the oxidation is in the range of 1150–1250° C.

5. A method according to claim 1, wherein the partial pressure of oxygen to induce the internal oxidation is not lower than 50%.

6. A method according to claim 1, wherein the temperatures respectively of the former stage of said heat treatment and the second heat treatment are each not lower than 1300° C. and lower than the melting point of the single crystal silicon, the temperature of the third heat treatment for internal oxidation is in the range of 1150°°–1280° C., and the partial pressure of oxygen during the third heat treatment is not lower than 50%.

7. A method according to claim 1, wherein the temperatures respectively of the former stage of said heat treatment and the second heat treatment are each not lower than 1300° C. and lower than the melting point of the single crystal silicon, the temperature of the third heat treatment for internal oxidation is in the range of 1150°–1250° C., and the partial pressure of oxygen during the third heat treatment is not lower than 50%.

8. A SIMOX substrate produced by the method set forth in claim 1.

* * * * *

UNITED STATES PATENT AND TRADEMARK OFFICE
CERTIFICATE OF CORRECTION

PATENT NO. : 6,767,801 B2 Page 1 of 1
DATED : July 27, 2004
INVENTOR(S) : Keisuke Kawamura et al.

It is certified that error appears in the above-identified patent and that said Letters Patent is hereby corrected as shown below:

<u>Column 14,</u>
Line 25, change "1150°-1250°" to -- 1150°-1280° --.

Signed and Sealed this

Sixteenth Day of August, 2005

JON W. DUDAS
*Director of the United States Patent and Trademark Office*